US010593863B2

(12) United States Patent
Azuma et al.

(10) Patent No.: US 10,593,863 B2
(45) Date of Patent: Mar. 17, 2020

(54) PIEZOELECTRIC CERAMIC SPUTTERING TARGET, LEAD-FREE PIEZOELECTRIC THIN FILM AND PIEZOELECTRIC THIN FILM ELEMENT USING THE SAME

(71) Applicant: TDK CORPORATION, Tokyo (JP)

(72) Inventors: Tomohisa Azuma, Tokyo (JP); Masaru Nanao, Tokyo (JP); Tatsuji Sano, Tokyo (JP); Masahito Furukawa, Tokyo (JP); Kenta Ishii, Tokyo (JP)

(73) Assignee: TDK CORPORATION, Tokyo (JP)

( * ) Notice: Subject to any disclaimer, the term of this patent is extended or adjusted under 35 U.S.C. 154(b) by 553 days.

(21) Appl. No.: 15/466,344

(22) Filed: Mar. 22, 2017

(65) Prior Publication Data
US 2017/0288128 A1 Oct. 5, 2017

(30) Foreign Application Priority Data

Mar. 29, 2016 (JP) ................. 2016-064897

(51) Int. Cl.
*H01L 41/187* (2006.01)
*H01L 41/193* (2006.01)
*C23C 14/08* (2006.01)
*C23C 14/34* (2006.01)
*H01J 37/34* (2006.01)
*H01L 41/047* (2006.01)
*H01L 41/297* (2013.01)
*H01L 41/316* (2013.01)

(52) U.S. Cl.
CPC ........ *H01L 41/1873* (2013.01); *C23C 14/088* (2013.01); *C23C 14/3407* (2013.01); *C23C 14/3414* (2013.01); *H01J 37/3426* (2013.01); *H01L 41/0471* (2013.01); *H01L 41/297* (2013.01); *H01L 41/316* (2013.01)

(58) Field of Classification Search
CPC ............ H01L 41/1873; H01L 41/0471; H01L 41/297; H01L 41/316; H01J 37/3426; C23C 14/088; C23C 14/3407; C23C 142/3414
USPC ....... 310/358; 501/134; 161/62.9 PZ, 62.9 R
See application file for complete search history.

(56) References Cited

U.S. PATENT DOCUMENTS

| 9,331,262 B2 | 5/2016 | Maejima et al. |
| 2008/0112109 A1* | 5/2008 | Muto ................. C04B 35/4682 361/301.4 |
| 2019/0062219 A1* | 2/2019 | Ketcham ................. C04B 35/48 |

FOREIGN PATENT DOCUMENTS

| JP | 2000-336474 A | 12/2000 |
| JP | 2007-204336 A | 8/2007 |
| JP | 2014-229902 A | 12/2014 |

\* cited by examiner

*Primary Examiner* — Thomas M Dougherty
(74) *Attorney, Agent, or Firm* — Oliff PLC

(57) ABSTRACT

A piezoelectric ceramic sputtering target containing a perovskite type oxide represented by chemical formula (I) of $ABO_3$ as a main component, wherein the component A of the chemical formula (I) contains at least K (potassium) and/or Na (sodium), the component B of the chemical formula (I) contains at least one selected from the group consisting of Nb (niobium), Ta (tantalum) and Zr (zirconium) with Nb (niobium) as a necessity, the piezoelectric ceramic sputtering target is composed of a plurality of crystal grains and grain boundaries existing among the crystal grains, and in the grain boundary, the molar ratio of at least one of Nb (niobium), Ta (tantalum), and Zr (zirconium) in the B components is higher than the molar ratio in the interior of the crystal grains by 30% or more.

12 Claims, 2 Drawing Sheets

PIEZOELECTRIC CERAMIC SPUTTERING TARGET, LEAD-FREE PIEZOELECTRIC THIN FILM AND PIEZOELECTRIC THIN FILM ELEMENT USING THE SAME

The present invention related to a piezoelectric ceramic sputtering target, a lead-free piezoelectric thin film and a piezoelectric thin film element using the same.

BACKGROUND

A piezoelectric ceramic exhibiting a so-called piezoelectric phenomenon is known in which mechanical distortion and stress are generated when an electric field is applied. Such a piezoelectric ceramic is used in a vibrating element such as an actuator, a sound generator, a sensor, or the like.

Lead zirconate titanate ($Pb(Zr,Ti)O_3$) with excellent piezoelectricity is most frequently used as the piezoelectric ceramic used in the above way. However, since lead zirconate titanate contains a large amount of lead, the influence on the global environment such as lead elution due to acid rain is regarded as a problem recently. Therefore, there is a need for lead-free piezoelectric ceramics to replace lead zirconate titanate, and various piezoelectric ceramics without lead have been proposed according to this requirement.

On the other hand, smaller size, higher performance and higher reliability are required with the electronic components, and the same trend is also found in piezoelectric components. Most piezoelectric components use a bulk body made by a sintering method, however, it occurs that processing for controlling the thickness becomes extremely difficult as its thickness becomes smaller and that the size of the crystal grain size causes deterioration of properties. As a means to solve this problem, researches on piezoelectric thin films made by various thin film forming methods and the application in the element using the same have been actively conducted in recent years.

For example, a sputtering method is a representative thin film forming method. Its mechanism is that a voltage is applied between a substrate (anode side) on which a thin film is to be deposited and a target (cathode side) made of material for thin film making which is opposite to the substrate in an inert gas atmosphere such as argon atmosphere, by which ionized rare gas atoms are forced to collide with the target which is a cathode material, and the constituent atoms of the target are knocked out by the energy, whereby a thin film is deposited on the opposite substrate.

In the film deposition using a sputtering method along with the miniaturization of electronic components, thin films with higher precision and higher quality are required. As to the requirement for thin films with higher quality, specifically, preparation of thin films with high density and less defect becomes a problem. In particular, defects generated in the thin film will cause defects such as generation of leakage current when the thin film is made into a product. Thus, various studies have been made, such as suppressing generation of particles or nodules.

For example, Patent Document 1 discloses a method of suppressing the generation of particles during the manufacturing of the thin film and suppressing the incidence of defective products of the dielectric film by devising a manufacturing method of a lead-based sputtering target.

PATENT DOCUMENTS

Patent Document 1: JP-A-2000-336474

SUMMARY

However, even if it is possible to sufficiently suppress the generation of particles during the preparation of a lead-free piezoelectric thin film, the generation of leakage current due to fine defects in the thin film still occurs, thus, further improvement is required.

The present invention is made in view of the above circumstances and aims to provide a piezoelectric ceramic sputtering target capable of sufficiently suppressing the occurrence of current leak during the manufacturing of a lead-free piezoelectric thin film. Further, the present invention aims to provide a lead-free piezoelectric thin film and a piezoelectric thin film element formed by using the piezoelectric ceramic sputtering target.

In order to achieve the above aims, the present inventors made various studies on methods capable of reducing the occurrence of leakage current. As a result, it was found that it is possible to obtain a sputtering target with a high quality by unevenly distributing specific elements at the grain boundary portion of the perovskite type oxide crystal grains constituting the sputtering target. And as a result of sputtering deposition using the obtained sputtering target, it is possible to sufficiently suppress occurrence of leakage current in the lead-free piezoelectric thin film.

That is, the present invention is a piezoelectric ceramic sputtering target comprising a perovskite type oxide represented by a chemical formula (I) of $ABO_3$ as a main component characterized in that the component A of the chemical formula (I) contains at least K (potassium) and/or Na (sodium), the component B of the chemical formula (I) contains at least one selected from the group consisting of Nb (niobium), Ta (tantalum) and Zr (zirconium) with Nb (niobium) as a necessity, the piezoelectric ceramic sputtering target is composed of a plurality of crystal grains and grain boundaries existing among the crystal grains, and in the grain boundary, the molar ratio of at least one of Nb (niobium), Ta (tantalum), and Zr (zirconium) in the B components is higher than the molar ratio in the grains of the crystal grains by 30% or more.

According to the present invention, it is possible to provide a piezoelectric ceramic sputtering target in which the occurrence of a leakage current during the producing of a lead-free piezoelectric thin film can be sufficiently suppressed. It is also possible to provide a lead-free piezoelectric thin film and a piezoelectric thin film element formed by using the piezoelectric ceramic sputtering target.

DETAILED DESCRIPTION OF EMBODIMENTS

Figure 1:
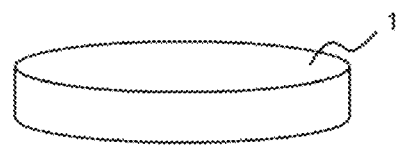
FIG. 1 is a perspective view showing an embodiment of a piezoelectric ceramic sputtering target according to the present invention.

Hereinafter, preferred embodiments of the present invention will be described below with reference to the drawings in some cases. Further, in the description of the drawings, same reference numerals are used for the same or equivalent elements, and repeated explanations are omitted.

(Piezoelectric Ceramic Sputtering Target)

FIG. 1 is a perspective view showing an embodiment of a piezoelectric ceramic sputtering target according to the present invention. Here, piezoelectric ceramic sputtering target 1 is constructed as an integral body. In addition, if necessary, processing for adjusting the flatness or thickness of the surface may be performed. The shape of piezoelectric ceramic sputtering target 1 is not necessarily circular. It may be elliptical, quadrilateral or polygonal. And there is no particular limitation on its size.

Figure 2:
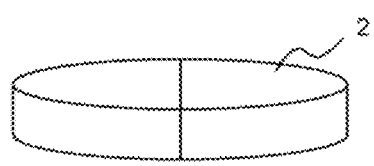
FIG. 2 is a perspective view showing another embodiment of a piezoelectric ceramic sputtering target according to the present invention.
Figure 2:
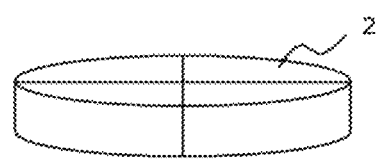
Figure 2:
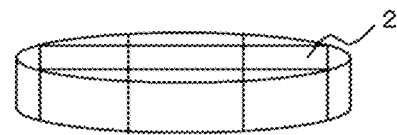

FIG. 2 is a perspective view showing another embodiment of the piezoelectric ceramic sputtering target of the present invention. Piezoelectric ceramic sputtering target 2 is composed of multiple divided pieces of two or more. Herein, the dividing lines are not necessarily straight lines, and they may be concentric circles or curved lines. Also, the shape of piezoelectric ceramic sputtering target 2 is not necessarily circular, and it may be elliptical, quadrilateral or polygonal. Likewise, there is no particular limitation on its size.

These piezoelectric ceramic sputtering targets 1 and 2 are fixed to, for example, a backing plate made of copper, and mounted on a sputtering apparatus to perform sputtering deposition.

The piezoelectric ceramic sputtering target of the present invention is characterized in that it comprises a perovskite type oxide represented by a chemical formula (I) of $ABO_3$ as a main component, wherein the component A of the chemical formula (I) contains at least K (potassium) and/or Na (sodium), the component B of the chemical formula (I) contains at least one selected from the group consisting of Nb (niobium), Ta (tantalum) and Zr (zirconium) with Nb (niobium) as a necessity, the piezoelectric ceramic sputtering target is composed of a plurality of crystal grains and grain boundaries existing among the crystal grains, and in the grain boundary, the molar ratio of at least one of Nb (niobium), Ta (tantalum), and Zr (zirconium) in the B components is higher than the molar ratio in the grains of the crystal grains by 30% or more.

Thereby, the occurrence of leakage current due to defects during the sputtering deposition using the perovskite type oxide target can be reduced for certain.

It is preferred that the component A of the chemical formula (I) contains Sr (strontium) and/or Li (lithium). Thereby, the amount of the alkaline component can be suppressed, and the component A can exist stably. It is preferred that the amount of Sr (strontium) and/or Li (lithium) is 20 mol % or less with respect to component A.

It is preferred that the component B of the chemical formula (I) contains Ta (tantalum) and/or Zr (zirconium). Thereby, even if a part of the component B exists in the grain boundary, it is possible to compensate for the reduction of the component B in the grain and to make the perovskite type oxide stable. It is preferred that the amount of Ta (tantalum) and/or Zr (zirconium) is 20 mol % or less with respect to the component B.

As a subcomponent of the piezoelectric ceramic sputtering target, a component of at least one of Mn (manganese) and Cu (copper) may also be contained, the amount of which may be 1 mass % or less in terms of MnO (manganese oxide) and CuO (copper oxide) respectively relative to the composition of the main component. Thereby, the sinterability is improved, and a sputtering target with a fine microstructure can be obtained.

Figure 3:
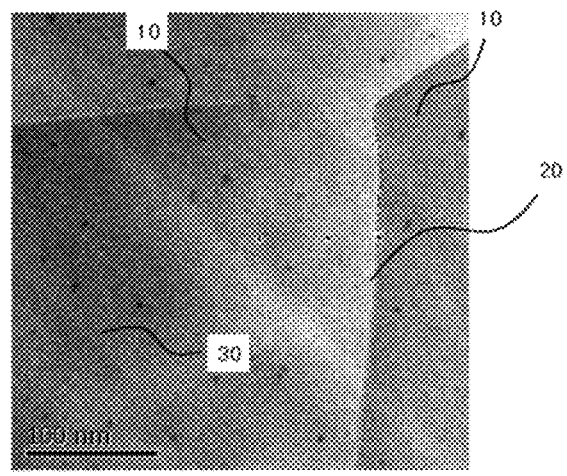
FIG. 3 is a field emission scanning transmission electron microphotograph showing an example of the microstructure of a piezoelectric ceramic sputtering target according to the present invention.

FIG. 3 is a scanning transmission electron microphotograph showing an example of the fine structure of the piezoelectric ceramic sputtering target according to the present invention. This piezoelectric ceramic sputtering target contains as a main component a perovskite type oxide containing alkali metal(s) and Nb as the constituent elements, and contains a compound of Mn as a subcomponent. In FIG. 3, three crystal grains of perovskite type oxides 10 and grain boundaries 20 formed among these crystal grains 10 are shown. As shown in FIG. 3, this piezoelectric ceramic sputtering target is constituted as an aggregate of crystal grains of perovskite type oxide 10. Usually, a so-called grain boundary layer exists as a very thin layer at the boundary portion among the crystal grains constituting a sintered body such as a piezoelectric ceramic (i.e. grain boundary 20).

The structure and composition in grain boundary 20 of the crystal of perovskite type oxide and in grain interior 30 of the crystal grains can be analyzed by using an FE-STEM (field-emission scanning transmission electron microscope) and an energy-dispersive X-ray spectroscopy (EDS) at each point of the fine structure of the piezoelectric ceramic sputtering target. As the FE-STEM in the present invention, JEM-2100F (product name) manufactured by JEOL Ltd. is used, and in the composition analysis, an energy dispersive X-ray spectroscopy (EDS) attached to the FE-STEM is used.

The molar ratio of at least one component of the component B at the grain boundary of the crystal grains is larger than the molar ratio in the grains of the crystal grains. Thereby, the deviation of the compositions sputtered from the grain boundary and the crystal grains can be reduced. And the defect formation in the sputtered lead-free piezoelectric thin film can be reduced. Also the number of occurrences of leakage current can be suppressed.

The piezoelectric ceramic sputtering target obtained as described above is bonded to a backing plate by using indium or the like as an adhesive.

(Method of Manufacturing a Piezoelectric Ceramic Sputtering Target)

Next, a method of manufacturing piezoelectric ceramic sputtering target 1 shown in FIG. 1 will be described below.

As the raw material of the main component and the subcomponent of the piezoelectric ceramic composition, Na (sodium), K (potassium), Li (lithium), Nb (niobium), Ta (tantalum), Sr (strontium), Zr (zirconium) and Ba (barium) or the like are prepared. Further, compound powders containing Mn (manganese) and Cu (copper), for example, is prepared as the subcomponent. Further, as the compound to be used as these raw materials, oxides or composite oxides of different elements or compounds such as carbonates and oxalates which will turn into oxides when heated can be used. Next, after these raw materials are sufficiently dried, they are weighed at such a ratio that the final composition will fall within the above-mentioned range. The ratio of the amount of the main component to the amount of the subcomponent is adjusted so that the ratio of the amount of the subcomponent when the main component and the subcomponent are taken as a whole become 3 mass % or less. The ratio of the amount of the subcomponent is preferably 1 mass % or less.

Next, these materials are mixed in an organic solvent or water using a ball mill, a bead mill or the like and then dried.

After calcining these materials at 650 to 1100° C., the calcined materials will be pulverized in an organic solvent or water with a ball mill, a bead mill or the like for example, and then dried to obtain a piezoelectric ceramic material powder.

A piezoelectric ceramic sputtering target according to an embodiment of the present invention is obtained by sintering the piezoelectric ceramic material powder and processing the shape.

For example, a binder is added to the piezoelectric ceramic material powder to granulate, and the granulated powder is press-molded using a uniaxial press molding machine or a cold isostatic press (CIP) or the like. The kind of the binder is not particularly limited, and it is not always necessary to use the binder if there is no problem in shape retention, handling property, sinterability and the like.

After shaping, for example, the molded compact is heated to remove the binder and further sintered at 950 to 1350° C. for 2 to 8 hours, by which a piezoelectric ceramic sintered body is obtained. As general parameters for sintering, there are sintering temperature, sintering time, heating rate, cooling rate, atmosphere and the like. In the present embodiment, the component of B site can be controlled to segregate more in the vicinity of the grain boundary than in the grains by adjusting the cooling rate.

In order to segregate the B site component at the grain boundaries of the crystal grains, it is preferable to lower the cooling rate during the sintering of the compact. Thereby, the B site component can be segregated at the grain boundary.

Next, the obtained piezoelectric ceramic sintered body can be processed to regulate the flatness and thickness of the surface if necessary to obtain piezoelectric ceramic sputtering target 1.

The piezoelectric ceramic sputtering target 1 obtained as described above is attached to a backing plate by using indium or the like as the adhesive, and is mounted onto a sputtering apparatus to be used in the film deposition.

Next, the manufacturing method of the piezoelectric ceramic sputtering target 2 according to another embodiment of the present invention will be described. The same steps from weighing, mixing, calcinating to granulation as those in the manufacturing of the above piezoelectric ceramic sputtering target 1 were carried out.

After granulation, the granulated powder can be press molded using a uniaxial press molding machine or a cold isostatic press (CIP) or the like to obtain a molded compact. The area of the molded compact at this stage is smaller than the final area of the completed target, but two or more pieces necessary for obtaining the final area of the completed target are prepared.

After molding, for example, the molded compact is heated to remove the binder, and further sintered at 950 to 1350° C. for 2 to 8 hours, by which a piezoelectric ceramic is obtained. It is possible to segregate more components of the B site in the vicinity of the grain boundaries than in the grains by adjusting the sintering temperature, sintering time, heating rate, cooling rate, atmosphere and the like according to the composition of the main component. By further proper adjusting, it is possible to segregate more Nb of the component of the B site in the vicinity of the grain boundaries than in the grains.

After sintering, the size of the outer circumference or the thickness, the surface conditions such as the surface roughness and the like can be adjusted if necessary, however, it is formed so as to obtain the final area after completion when the pieces have been adhered. Herein, the dividing lines are not necessarily straight lines, and they may be concentric circles or curved lines. Further, the shape is not necessarily circular, and it may be elliptical, quadrilateral or polygonal.

The piezoelectric ceramic sputtering target 2 obtained as described above is bonded in a way that pieces are adhered to each other on the backing plate by using indium or the like as the adhesive, and is mounted onto a sputtering apparatus to be used in the film deposition.

The divided type of piezoelectric ceramic sputtering target 2 as shown in FIG. 2 is used in the steps for obtaining the piezoelectric ceramic sintered body when the size of the piezoelectric ceramic sintered body which can be manufactured cannot satisfy the size of the target piezoelectric ceramic sputtering target 2, or when the molding pressure for increasing the density of the piezoelectric ceramic sintered body is demanded to be ensured in certainty. Thus, the manufacturing processes are basically the same as the processes of the above-described piezoelectric ceramic sputtering target 1 respectively. However, when it is bonded to the backing plate at last, precise surface processing is required so that individual divided targets can be assembled without gaps.

(Piezoelectric Thin Film Element)

The piezoelectric ceramic sputtering target obtained as described above is fixed to a copper backing plate by using indium as the adhesive.

Hereinafter, the term "substrate" means a body with a film deposited in each step. A silicon wafer as a substrate is placed in a vacuum chamber of an RF sputtering apparatus. After the vacuum exhausting, Pt (platinum) is deposited as a lower electrode layer with a film thickness of 50 to 350 nm.

Subsequently, the substrate is transferred to a chamber of an RF sputtering apparatus in which a piezoelectric ceramic sputtering target with a backing plate is mounted. After the vacuum exhausting, a reverse sputtering is performed to the substrate. As the atmospheric gas during the reverse sputtering, Ar (argon) is supplied into the chamber. A power of 100 to 1000 W is applied under a pressure of 0.5 to 1.5 Pa and a treatment is performed for 5 to 300 seconds.

Following the reverse sputtering, a lead-free piezoelectric thin film is deposited as a piezoelectric layer on the substrate by using the piezoelectric ceramic sputtering target with the backing plate. The substrate temperature during the film deposition is 500 to 800° C., and the thickness of the piezoelectric layer is 1000 to 3500 nm.

Figure 4:
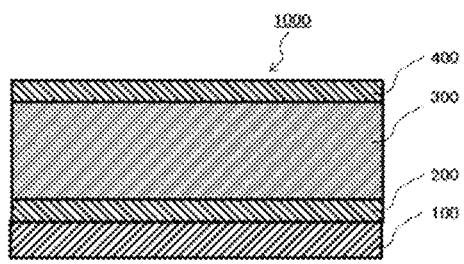
FIG. 4 is a cross-sectional view showing an embodiment of a lead-free piezoelectric thin film element formed by using a piezoelectric ceramic sputtering target according to the present invention.

Thereafter, an upper electrode Pt is deposited with a film thickness of 50 to 350 nm by sputtering. Thereby, as shown in FIG. 4, piezoelectric thin film element 1000 constituted by substrate 100, lower electrode 200, lead-free piezoelectric thin film 300, and upper electrode 400 in this order is obtained. It is shown in FIG. 4. It may be cut or insulating coated if necessary. Further, piezoelectric thin film element 1000 may be a structure in which lead-free piezoelectric thin film 300 is sandwiched between lower electrode 200 and upper electrode 400, and substrate 100 may be omitted.

EXAMPLES

Hereinafter, the present invention will be described more specifically based on Examples and Comparative Examples; however, the present invention is not to be limited to the following Examples.

Comparative Example 1

Piezoelectric ceramic sputtering target 1 as shown in FIG. 1 was prepared by the following steps. First, $Na_2CO_3$ (sodium carbonate) powder, $K_2CO_3$ (potassium carbonate) powder, and $Nb_2O_5$ (niobium oxide) powder were prepared. After these raw materials were sufficiently dried, each raw material was weighed so that the final composition would be that shown in the following formula (1).

$$(K_{0.400}Na_{0.600})_{0.975}NbO_3 \qquad (1)$$

Na$_2$CO$_3$ (sodium carbonate) powder, K$_2$CO$_3$ (potassium carbonate) powder and Nb$_2$O$_5$ (niobium oxide) powder weighed as described above were sufficiently mixed in ethanol using a ball mill, then dried and press-molded, and calcinated under 950° C. for 2 hours.

After the mixture was calcined, the calcined product was sufficiently pulverized in ethanol using a ball mill, dried again, and granulated by adding a binder (PVA: polyvinyl alcohol) solution. The obtained granulated powder was press-molded using a uniaxial press-molding machine to obtain a molded compact. If there was no problem in fabrication, binder was not necessarily used. Thereafter, CIP molding was carried out, and this molded compact was heated to 600° C. to remove the binder. After a further CIP molding, a piezoelectric ceramic sintered body was obtained by sintering at 1100° C. for 2 hours in an atmospheric ambient with a heating rate of 200° C./hour and cooling with a cooling rate of 10° C./hour. With respect to the piezoelectric ceramic sintered body obtained thereby, it was confirmed by XRD that it was a perovskite structure and no different phase exists.

The obtained piezoelectric ceramic sintered body was subject to a surface grinding to obtain piezoelectric ceramic sputtering target 1.

Examples 1 to 8, Comparative Examples 2 and 3

The preparation method and the evaluation method were the same as those in Comparative Example 1 except that the composition of the composite oxide which was the main component of the piezoelectric ceramic was set as the formula (1) and the cooling rate during the sintering process was set as shown in Table 1.

Hereinafter, the raw materials were used properly according to the composition formula. Powders of Na$_2$CO$_3$ (sodium carbonate), K$_2$CO$_3$ (potassium carbonate), Li$_2$CO$_3$ (lithium carbonate), Nb$_2$O$_5$ (niobium oxide), Ta$_2$O$_5$ (tantalum oxide), SrCO$_3$ (strontium carbonate), ZrO$_2$ (zirconium oxide) and BaCO$_3$ (barium carbonate) were prepared. In addition, powders of CuO (copper oxide) and MnCO$_3$ (manganese carbonate) were prepared as the raw materials of subcomponent.

Example 9

Piezoelectric ceramic sputtering target 1 as shown in FIG. 1 was prepared by the following steps. The preparation method and the evaluation method were the same as those in Comparative Example 1 except that the raw materials were weighed respectively to obtain a final composition of the following formula (2) after the raw materials were sufficiently dried and the cooling rate during the sintering process was set as shown in Table 1.

$$(K_{0.381}Na_{0.571}Sr_{0.048})_{0.975}NbO_3 \qquad (2)$$

Example 10

The preparation method and the evaluation method were the same as those in Comparative Example 1 except that the raw materials were weighed respectively to obtain a final composition of the following formula (3) after the raw materials were sufficiently dried and the cooling rate during the sintering process was set as shown in Table 1.

$$(K_{0.381}Na_{0.571}Li_{0.048})_{0.975}NbO_3 \qquad (3)$$

Example 11

The preparation method and the evaluation method were the same as those in Comparative Example 1 except that the raw materials were weighed respectively to obtain a final composition of the following formula (4) after the raw materials were sufficiently dried and the cooling rate during the sintering process was set as shown in Table 1.

$$(K_{0.362}Na_{0.542}Li_{0.048}Sr_{0.048})_{0.975}NbO_3 \qquad (4)$$

Example 12

The preparation method and the evaluation method were the same as those in Comparative Example 1 except that the raw materials were weighed respectively to obtain a final composition of the following formula (5) after the raw materials were sufficiently dried and the cooling rate during the sintering process was set as shown in Table 1.

$$(K_{0.400}Na_{0.600})_{0.975}(Nb_{0.900}Ta_{0.100})O_3 \qquad (5)$$

Example 13

The preparation method and the evaluation method were the same as those in Comparative Example 1 except that the raw materials were weighed respectively to obtain a final composition of the following formula (6) after the raw materials were sufficiently dried and the cooling rate during the sintering process was set as shown in Table 1.

$$(K_{0.044}Na_{0.600})_{0.975}(Nb_{0.952}Zr_{0.048})O_3 \qquad (6)$$

Example 14

The preparation method and the evaluation method were the same as those in Comparative Example 1 except that the raw materials were weighed respectively to obtain a final composition of the following formula (7) after the raw materials were sufficiently dried and the cooling rate during the sintering process was set as shown in Table 1.

$$(K_{0.400}Na_{0.600})_{0.975}(Nb_{0.857}Ta_{0.095}Zr_{0.048})O_3 \qquad (7)$$

Example 15

The preparation method and the evaluation method were the same as those in Comparative Example 1 except that the raw materials were weighed respectively to obtain a final composition of the following formula (8) after the raw materials were sufficiently dried and the cooling rate during the sintering process was set as shown in Table 1.

$$(K_{0.359}Na_{0.540}Li_{0.048}Ba_{0.005}Sr_{0.048})_{0.975}(Nb_{0.857}Ta_{0.095}Zr_{0.048})O_3 \qquad (8)$$

Example 16

The preparation method and the evaluation method were the same as those in Comparative Example 1 except that the raw materials were weighed respectively to obtain a final composition of the following formula (9) after the raw materials were sufficiently dried and the cooling rate during the sintering process was set as shown in Table 1.

$$(K_{0.359}Na_{0.540}Li_{0.048}Ba_{0.005}Sr_{0.048})_{0.975}(Nb_{0.857}Ta_{0.095}Zr_{0.048})O_3+CuO0.5 \text{ mass } \% \qquad (9)$$

Example 17

The preparation method and the evaluation method were the same as those in Comparative Example 1 except that the raw materials were weighed respectively to obtain a final composition of the following formula (10) after the raw materials were sufficiently dried and the cooling rate during the sintering process was set as shown in Table 1.

$$(K_{0.359}Na_{0.540}Li_{0.048}Ba_{0.005}Sr_{0.048})_{0.975}$$
$$(Nb_{0.857}Ta_{0.095}Zr_{0.048})O_3+MnCO_3\ 0.5\ \text{mass}\ \% \quad (10)$$

The obtained piezoelectric ceramic sputtering targets were appropriately processed. Structure and composition analysis were carried out for crystal grains 10 and grain boundaries 20 of the perovskite type oxides using the FE-STEM (field emission type scanning transmission electron microscope) and energy dispersive X-ray spectroscopy (EDS) at each point of the microstructure. Regarding the molar ratio of Nb in the B site components, an average value of 10 or more points per grain was calculated relative to grain interiors 30 and grain boundaries 20 of crystal grains 10. Herein, grain interior 30 is a point 100 nm or more away from the grain boundary. The ratio of the average value of the molar ratio of Nb in the B site components of grain boundary 20 was determined based on the average value of the molar ratios of Nb in the B site components of grain interior 30 of grain 10. This was carried out for randomly selected 100 crystal grains and the average value was deemed as the Nb ratio in the grain boundary of the piezoelectric ceramic sputtering target.

Subsequently, the obtained piezoelectric ceramic sputtering target was fixed to a copper backing plate using indium as an adhesive.

A silicon wafer with a diameter of 3 inches and a thickness of 400 μm with a thermal oxide film ($SiO_2$: insulating layer) as a substrate was placed in a vacuum chamber of an RF sputtering apparatus. After vacuum exhausting, Pt (platinum) was deposited as a lower electrode layer. The substrate temperature during film deposition was 400° C., and the thickness of the lower electrode layer was 200 nm.

Subsequently, the substrate was transferred to a chamber of an RF sputtering apparatus to which a piezoelectric ceramic sputtering target 1 with a backing plate was mounted. After vacuum exhausting was performed, a reverse sputtering was performed on the substrate. Ar (argon) was supplied with a speed of 50 sccm into the chamber as an atmosphere gas during the reverse sputtering, and a power of 500 W was applied under a pressure of 1 Pa to treat for 30 seconds.

Following the reverse sputtering, a lead-free piezoelectric thin film was deposited as a piezoelectric layer on the substrate by using piezoelectric ceramic sputtering target 1 with the backing plate. The substrate temperature during film deposition was 600° C., and the thickness of the piezoelectric layer was 2000 nm.

Thereafter, a plurality of upper electrodes Pt were deposited by sputtering on the wafer with a film thickness of 200 nm and a diameter of φ100 μm.

One hundred electrodes were randomly selected from the above upper electrodes, and the leakage current when 10 kV/m was applied was measured with a ferroelectric evaluation system TF-1000 (manufactured by aixact). Those with a leakage current of 10 μA/cm² or more were regarded as defective products with a large leakage current and the defective rate was recorded.

The measured results were described below using Table 1.

TABLE 1

| | Composition Formula | Cooling rate (° C./hr) | Ratio of Nb in grain boundary (%) | Defective rate (%) | Determination |
|---|---|---|---|---|---|
| Comparative Example 1 | (1) | 10 | 27 | 15 | X |
| Example 1 | (1) | 20 | 36 | 12 | Δ |
| Example 2 | (1) | 30 | 45 | 6 | ○ |
| Example 3 | (1) | 40 | 52 | 0 | ⊚ |
| Example 4 | (1) | 50 | 56 | 0 | ⊚ |
| Example 5 | (1) | 60 | 54 | 0 | ⊚ |
| Example 6 | (1) | 70 | 51 | 0 | ⊚ |
| Example 7 | (1) | 80 | 42 | 8 | ○ |
| Example 8 | (1) | 90 | 34 | 10 | Δ |
| Comparative Example 2 | (1) | 100 | 21 | 18 | X |
| Comparative Example 3 | (1) | 200 | 11 | 25 | X |
| Example 9 | (2) | 40 | 45 | 5 | ○ |
| Example 10 | (3) | 40 | 41 | 5 | ○ |
| Example 11 | (4) | 40 | 58 | 0 | ⊚ |
| Example 12 | (5) | 40 | 46 | 4 | ○ |
| Example 13 | (6) | 40 | 48 | 3 | ○ |
| Example 14 | (7) | 40 | 58 | 0 | ⊚ |
| Example 15 | (8) | 40 | 60 | 0 | ⊚ |
| Example 16 | (9) | 40 | 62 | 0 | ⊚ |
| Example 17 | (10) | 40 | 66 | 0 | ⊚ |

Table 1 showed the compositions and the cooling rates during the sintering process of Examples 1 to 17 and Comparative Examples 1 to 3. Further, for each condition, the leakage numbers after sintering and the molar ratios of Nb amount at the grain boundary based on that in grain interiors were summarized. In Table 1, the ratios of the molar ratio in the grain boundary relative to the molar ratio in the center of the grain interiors were shown.

Also, in Table 1, those with a large leakage current on the piezoelectric layer deposited by using the piezoelectric ceramic sputtering target prepared under these conditions were shown in a form of defective rate. Herein, if the defective rate was 15% or more, it was determined as not preferable and the determination was "x". If the defective rate was 10 to 14%, it was determined to be Δ as a preferable film. If the defective rate was 1 to 9%, it was determined to be ○ as a more preferable film. And if the defective rate was 0%, it was determined to be ⊚ as a further preferable film.

From these results, it could be seen that when the ratio of Nb in the B site components at the grain boundaries of the piezoelectric sputtering target was more than that in the crystal grains by 30% or higher, the number of large leakage currents generated can be reduced by the lead-free piezoelectric thin film using the target. In particular, when the ratio of Nb in the B site components was 40% or more, especially when it was 50% or more, remarkable reduction in leakage current generation could be realized.

Since the lead-free piezoelectric thin film produced by the piezoelectric ceramic sputtering target of the present invention reduces defects caused by particle adhesion, it is possible to provide a piezoelectric thin film element with low defective rate and high reliability. For example, it is also useful in piezoelectric sensors such as yaw rate sensors, acceleration sensors, pressure sensors, vibration sensors, pulse wave sensors, and the like, in addition to piezoelectric actuators and ink jet printers of head assemblies of hard disk drives.

DESCRIPTION OF REFERENCE NUMERALS 1, 2 piezoelectric ceramic sputtering target
10 grain 20 grain boundary
30 grain interior
100 substrate
200 lower electrode
300 lead-free piezoelectric thin film
400 upper electrode
1000 piezoelectric thin film element

What is claimed is:

1. A piezoelectric ceramic sputtering target comprising a perovskite type oxide represented by chemical formula (I) of $ABO_3$ as a main component, wherein the component A of the chemical formula (I) contains at least K (potassium) and/or Na (sodium),
    the component B of the chemical formula (I) contains at least one selected from the group consisting of Nb (niobium), Ta (tantalum) and Zr (zirconium) with Nb (niobium) as a necessity,
    the piezoelectric ceramic sputtering target is composed of a plurality of crystal grains and grain boundaries existing among the crystal grains,
    and in the grain boundary, the molar ratio of at least one of Nb (niobium), Ta (tantalum), and Zr (zirconium) in the component B is higher than the molar ratio in the interior of the crystal grains by 30% or more.

2. The piezoelectric ceramic sputtering target of claim 1, wherein
    the component A further contains Sr (strontium) and/or Li (lithium).

3. The piezoelectric ceramic sputtering target of claim 1, wherein
    Mn (manganese) and/or Cu (copper) are/is further contained as subcomponent, and the subcomponent is contained in an amount of 1 mass % or less when Mn and Cu are calculated in terms of MnO and CuO respectively.

4. A lead-free piezoelectric thin film deposited by using the piezoelectric ceramic sputtering target of claim 1.

5. A piezoelectric thin film element comprising the lead-free piezoelectric thin film of claim 4, a lower electrode and an upper electrode sandwiching the lead-free piezoelectric thin film.

6. The piezoelectric ceramic sputtering target of claim 2, wherein
    Mn (manganese) and/or Cu (copper) are/is further contained as subcomponent, and the subcomponent is contained in an amount of 1 mass % or less when Mn and Cu are calculated in terms of MnO and CuO respectively.

7. A lead-free piezoelectric thin film deposited by using the piezoelectric ceramic sputtering target of claim 2.

8. A lead-free piezoelectric thin film deposited by using the piezoelectric ceramic sputtering target of claim 3.

9. A lead-free piezoelectric thin film deposited by using the piezoelectric ceramic sputtering target of claim 6.

10. A piezoelectric thin film element comprising the lead-free piezoelectric thin film of claim 7, a lower electrode and an upper electrode sandwiching the lead-free piezoelectric thin film.

11. A piezoelectric thin film element comprising the lead-free piezoelectric thin film of claim 8, a lower electrode and an upper electrode sandwiching the lead-free piezoelectric thin film.

12. A piezoelectric thin film element comprising the lead-free piezoelectric thin film of claim 9, a lower electrode and an upper electrode sandwiching the lead-free piezoelectric thin film.

* * * * *